(12) United States Patent
Ham

(10) Patent No.: US 11,233,281 B2
(45) Date of Patent: Jan. 25, 2022

(54) BATTERY PACK

(71) Applicant: LG Chem, Ltd., Seoul (KR)

(72) Inventor: Sang-Hyeok Ham, Daejeon (KR)

(73) Assignee: LG Energy Solution, Ltd.

( * ) Notice: Subject to any disclaimer, the term of this patent is extended or adjusted under 35 U.S.C. 154(b) by 143 days.

(21) Appl. No.: 16/614,972

(22) PCT Filed: Nov. 28, 2018

(86) PCT No.: PCT/KR2018/014864
§ 371 (c)(1),
(2) Date: Nov. 19, 2019

(87) PCT Pub. No.: WO2019/107935
PCT Pub. Date: Jun. 6, 2019

(65) Prior Publication Data
US 2020/0203781 A1 Jun. 25, 2020

(30) Foreign Application Priority Data

Nov. 28, 2017 (KR) .......................... 10-2017-0160050

(51) Int. Cl.
H01M 10/48 (2006.01)
H01M 10/44 (2006.01)
(Continued)

(52) U.S. Cl.
CPC ....... *H01M 10/482* (2013.01); *H01M 10/441* (2013.01); *H01M 10/46* (2013.01);
(Continued)

(58) Field of Classification Search
CPC ............... H01M 10/42; H01M 10/425; H01M 10/4257; H01M 10/46; H01M 10/48;
(Continued)

(56) References Cited

U.S. PATENT DOCUMENTS 5,107,191 A * 4/1992 Lowndes ................ B60L 58/15
318/139
5,357,187 A * 10/1994 Park ........................ H02J 7/008
320/116

(Continued)

FOREIGN PATENT DOCUMENTS

CN 105548892 A 5/2016
EP 2866042 A1 4/2015
(Continued)

OTHER PUBLICATIONS

International Search Report for Application No. PCT/KR2018/014864, dated Mar. 21, 2019, pp. 1-2.
(Continued)

*Primary Examiner* — Helen Rossoshek
(74) *Attorney, Agent, or Firm* — Lerner, David, Littenberg, Krumholz & Mentlik, LLP

(57) ABSTRACT

A battery pack including a first charging contactor and a second charging contactor; a first measurement resistor, a second measurement resistor and a third measurement resistor electrically connected to at least two of one ends and the other ends of the first charging contactor and the second charging contactor; a first measurement contactor, a second measurement contactor and a third measurement contactor electrically connected to at least one of the first measurement resistor, the second measurement resistor and the third measurement resistor; and a control unit configured to control an operation state of at least one of the first measurement contactor, the second measurement contactor and the third measurement contactor based on whether at least one of a charging start request signal and a charging end request signal is received.

7 Claims, 4 Drawing Sheets

(51) Int. Cl.
*H01M 10/46* (2006.01)
*H02J 7/00* (2006.01)
*H01M 50/20* (2021.01)

(52) U.S. Cl.
CPC ........... *H01M 50/20* (2021.01); *H02J 7/0045* (2013.01); *H02J 7/0047* (2013.01); *H01M 2200/00* (2013.01); *H01M 2220/20* (2013.01)

(58) Field of Classification Search
CPC .. H01M 10/441; H01M 10/482; H01M 50/20; H01M 2200/00; H01M 2220/20; H01M 2010/4271; H01M 10/44; H02J 7/0047; H02J 7/0045; H02J 2310/48; H02J 7/0032; G01R 31/3277; Y02T 90/14; Y02T 90/12; Y02E 60/10
See application file for complete search history.

(56) References Cited

U.S. PATENT DOCUMENTS

| | | | |
|---|---|---|---|
| 5,497,112 | A | 3/1996 | Hoang |
| 7,368,829 | B2* | 5/2008 | Tezuka .................. H01H 47/002 307/9.1 |
| 8,723,527 | B2* | 5/2014 | Kudo .................... B60L 3/0046 324/433 |
| 9,007,066 | B2* | 4/2015 | Sufrin-Disler .......... H02J 9/002 324/433 |
| 9,595,847 | B2* | 3/2017 | Dao .................... H01M 10/441 |
| 10,315,531 | B2* | 6/2019 | Mifsud .................. B60R 16/02 |
| 2006/0012336 | A1* | 1/2006 | Fujita .................. H01M 10/482 320/119 |
| 2010/0327817 | A1 | 12/2010 | Tabuta |
| 2012/0139479 | A1 | 6/2012 | Yun |
| 2015/0137767 | A1 | 5/2015 | Kim |
| 2015/0241500 | A1 | 8/2015 | Mochizuki et al. |
| 2016/0146901 | A1 | 5/2016 | Ohta |
| 2016/0169976 | A1* | 6/2016 | Miura .................... B60L 3/0069 324/434 |
| 2016/0241057 | A1 | 8/2016 | Yang |
| 2016/0243954 | A1* | 8/2016 | Moro .................... B60L 58/22 |
| 2017/0244239 | A1 | 8/2017 | Jin et al. |
| 2018/0006340 | A1* | 1/2018 | Yamamoto .............. B60L 58/21 |
| 2018/0024201 | A1* | 1/2018 | Izawa ................. G01R 31/3835 324/434 |
| 2018/0309171 | A1* | 10/2018 | Qin .................... H01M 10/4207 |
| 2019/0187211 | A1 | 6/2019 | Muller et al. |
| 2020/0044459 | A1* | 2/2020 | Lee ......................... G01R 31/36 |
| 2020/0049770 | A1* | 2/2020 | Ham .................... H01M 10/425 |
| 2020/0052352 | A1* | 2/2020 | Ham .................... H02J 7/00036 |
| 2020/0088803 | A1* | 3/2020 | Park ...................... G01R 27/02 |
| 2020/0112069 | A1* | 4/2020 | Ham ...................... H01M 10/42 |
| 2020/0112185 | A1* | 4/2020 | Ham .................... H02J 7/00041 |
| 2020/0116791 | A1* | 4/2020 | Song ..................... G01R 31/52 |
| 2020/0174075 | A1* | 6/2020 | Ham ...................... H01M 10/42 |
| 2020/0217893 | A1* | 7/2020 | Song .................... H01M 10/425 |
| 2021/0033483 | A1* | 2/2021 | Ko ....................... H01M 10/613 |
| 2021/0141020 | A1* | 5/2021 | Hofer .................... G01R 31/374 |

FOREIGN PATENT DOCUMENTS

| | | |
|---|---|---|
| EP | 3070810 A1 | 9/2016 |
| JP | 2009189160 A | 8/2009 |
| JP | 201457454 A | 3/2014 |
| JP | 2015082456 A | 4/2015 |
| JP | 2015092818 A | 5/2015 |
| JP | 2016100983 A | 5/2016 |
| KR | 960006278 A | 2/1996 |
| KR | 101182890 B1 | 9/2012 |
| KR | 20130051228 A | 5/2013 |
| KR | 20140136844 A | 12/2014 |
| KR | 20150057732 A | 5/2015 |
| KR | 20160043543 A | 4/2016 |
| KR | 20160099361 A | 8/2016 |
| KR | 101716886 B1 | 3/2017 |
| KR | 20170099672 A | 9/2017 |

OTHER PUBLICATIONS

Extended European Search Report including Written Opinion for Application No. EP18884322.1, dated Sep. 21, 2020, pp. 1-8.

\* cited by examiner

BATTERY PACK

CROSS-REFERENCE TO RELATED APPLICATIONS

This application is a national phase entry under 35 U.S.C. § 371 of International Application No. PCT/KR2018/014864, filed Nov. 28, 2018, which claims priority to Korean Patent Application No. 10-2017-0160050, filed Nov. 28, 2017, the disclosures of which are incorporated herein by reference.

TECHNICAL FIELD

The present disclosure relates to a battery pack, and more particularly, to a battery pack for preventing an electric shock accident caused by a power connector by controlling a measurement contactor.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at the present include nickel-cadmium batteries, nickel hydrogen batteries, nickel-zinc batteries, lithium secondary batteries and the like. Among them, the lithium secondary batteries are in the limelight since they have almost no memory effect compared to nickel-based secondary batteries and also have very low self-discharging rate and high energy density.

In particular, the battery pack includes a battery module in which a plurality of battery cells are electrically connected, thereby meeting a high-capacity and high-power design required for an electric vehicle. The battery pack applied to an electric vehicle may be electrically connected to a charger of a charging station to charge the electric power.

To this end, the battery pack applied to an electric vehicle may include a battery contactor connected to a positive electrode terminal and a negative electrode terminal of the battery module to control the electrical connection of the output terminals of the battery module, and a charging contactor for controlling the electrical connection between the battery contactor and a charging terminal to which the power of the charger is input.

A high voltage is not applied to the charging contactor during the charging process, and there is a demand for a technique of controlling a peripheral circuit of the charging contactor so that a voltage is not applied to the charging contactor in response to the charging process as the charging contactor is exposed to the outside.

DISCLOSURE

Technical Problem

The present disclosure is directed to providing a battery pack, which may prevent a user from being electrically shocked due to a charging contactor exposed to the outside, by controlling an operation state of a first measurement contactor, a second measurement contactor and a third measurement contactor electrically connected to a first input terminal and a second input terminal of the charging contactor based on a charging start request signal and a charging end request signal.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack, comprising: a first battery contactor, wherein a first end of the first battery contactor is configured to be electrically connected to a positive electrode terminal of a battery; a second battery contactor, wherein a first end of the second battery contactor is configured to be electrically connected to a negative electrode terminal of the battery; a first charging contactor, wherein a first end of the first charging contactor is electrically connected to a second end of the first battery contactor; a second charging contactor, wherein a first end of the second charging contactor is electrically connected to a second end of the second battery contactor; a first measurement resistor electrically connected between a first node located at the first end of the second charging contactor and a second node located at the first end of the first charging contactor; a second measurement resistor electrically connected between the first node and a third node located at a second end of the first charging contactor; a third measurement resistor electrically connected between the first node and a fourth node located at a second end of the second charging contactor; a first measurement contactor electrically connected between the first node and the first measurement resistor; a second measurement contactor electrically connected between the first node and the second measurement resistor; a third measurement contactor electrically connected between the first node and the third measurement resistor; and a control unit configured to control at least one of an operation state of the first measurement contactor, an operation state of the second measurement contactor or an operation state of the third measurement contactor based on whether at least one of a charging start request signal or a charging end request signal is received.

Preferably, when the charging start request signal is received, the control unit may be configured to control the operation states of the first measurement contactor, the second measurement contactor and the third measurement contactor to turn on, and subsequently control operation states of the first charging contactor and the second charging contactor to turn on.

Preferably, when the charging end request signal is received, the control unit may be configured to control an operation state of the first charging contactor to turn off, and subsequently control the operation states of the first measurement contactor and the second measurement contactor based on a measured voltage difference between a first measured voltage measured across the first measurement resistor and a second measured voltage measured across the second measurement resistor.

Preferably, when the measured voltage difference is equal to or greater than a preset first control voltage, the control unit may be configured to control the operation states of the first measurement contactor and the second measurement contactor to turn off.

Preferably, when the charging end request signal is received, the control unit may be configured to control an operation state of the second charging contactor to turn off, and subsequently control the operation state of the third measurement contactor based on a third measured voltage measured across the third measurement resistor.

Preferably, when the third measured voltage is equal to or greater than a preset second control voltage, the control unit may be configured to control the operation state of the third measurement contactor to turn off.

In another aspect of the present disclosure, there is also provided a vehicle comprising the battery pack of any of the embodiments described above.

Advantageous Effects

According to at least one of embodiments of the present disclosure, it is possible to prevent a user from being electrically shocked due to a charging contactor exposed to the outside, by controlling an operation state of a first measurement contactor, a second measurement contactor and a third measurement contactor electrically connected to a first input terminal and a second input terminal of the charging contactor based on a charging start request signal and a charging end request signal.

The effects of the present disclosure are not limited to the above, and other effects not mentioned herein may be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a battery pack 100 device according to an embodiment of the present disclosure will be described.

Figure 1:
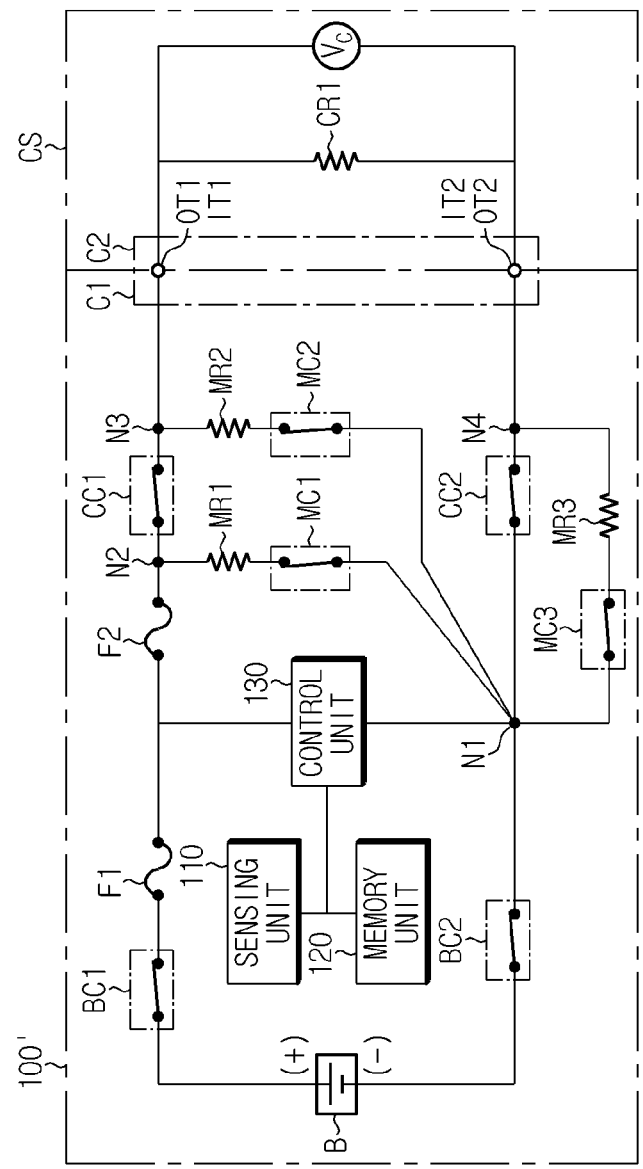
FIG. 1 is a diagram showing a functional configuration of a battery pack according to an embodiment of the present disclosure in a state where the battery pack is coupled to a charger.
Figure 2:
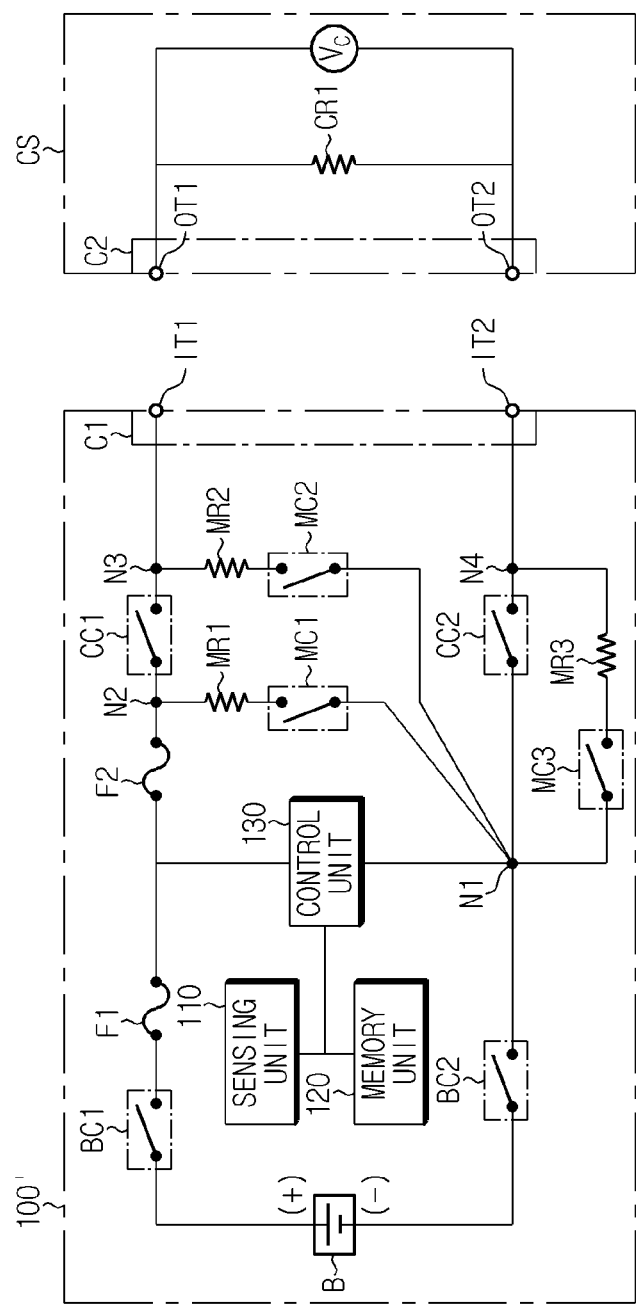
FIG. 2 is a diagram showing a functional configuration of the battery pack according to an embodiment of the present disclosure in a state where the battery pack is separated from the charger.

FIG. 1 is a diagram showing a functional configuration of a battery pack 100 according to an embodiment of the present disclosure in a state where the battery pack 100 is coupled to a charger CS, and FIG. 2 is a diagram showing a functional configuration of the battery pack 100 according to an embodiment of the present disclosure in a state where the battery pack 100 is separated from the charger CS.

First, referring to FIG. 1, the battery pack 100 includes a battery module B, a first battery contactor BC1, a second battery contactor BC2, a first charging contactor CC1, a second charging contactor CC2, a first measurement resistor MR1, a second measurement resistor MR2, a third measurement resistor MR3, a first measurement contactor MC1, a second measurement contactor MC2, a third measurement contactor MC3, a first power connector C1, a sensing unit 110, a memory unit 120 and a control unit 130.

The battery module B may include at least one battery cell. If the battery module B includes a plurality of battery cells electrically connected, the plurality of battery cells may be connected to each other in series, in parallel or in series and parallel. The battery module B has a positive electrode terminal (+) and a negative electrode terminal (−).

One end of the first battery contactor BC1 is electrically connected to the positive electrode terminal (+) of the battery module B, and one end of the second battery contactor BC2 is electrically connected to the negative electrode terminal (−) of the battery module B.

By doing so, the battery module B may output power or be charged according to a turn-on state or a turn-off state of the first battery contactor BC1 and the second battery contactor BC2.

The first battery contactor BC1 and the second battery contactor BC2 may be controlled into a turn-on state or a turn-off state by the control unit 130, explained later.

Here, the turn-on state means a state where a contact point of the contactor is in contact to make one end and the other end of the contactor be electrically connected. Also, the turn-off state means a state where the contact point of the contactor is separated to make one end and the other end of the contactor be electrically disconnected.

One end of the first charging contactor CC1 is electrically connected to the other end of the first battery contactor BC1, and one end of the second charging contactor CC2 is electrically connected to the other end of the second battery contactor BC2.

In addition, the other ends of the first charging contactor CC1 and the second charging contactor CC2 are electrically connected to the first power connector C1, respectively. More specifically, the other end of the first charging contactor CC1 is electrically connected to a first input terminal IT1 provided at the first power connector C1, and the other end of the second charging contactor CC2 is electrically connected to a second input terminal IT2 provided at the first power connector C1.

Meanwhile, if a second power connector C2 of the charger CS is connected to the first power connector C1, a first output terminal OT1 and a second output terminal OT2 of the second power connector C2 may be electrically connected to the first input terminal IT1 and the second input terminal IT2, respectively.

Accordingly, when the first battery contactor BC1, the second battery contactor BC2, the first charging contactor CC1 and the second charging contactor CC2 are in a turn-on state, if the second power connector C2 is connected to the first power connector C1, the power of the charger CS is supplied to charge the battery module B.

Meanwhile, a second node N2 and a third node N3 are located at one end and the other end of the first charging contactor CC1, respectively, and a first node N1 and a fourth node N4 are located at one end and the other end of the second charging contactor CC2, respectively.

The first measurement resistor MR1 is electrically connected between the first node N1 and the second node N2. At this time, the first measurement contactor MC1 is electrically connected between the first measurement resistor MR1 and the first node N1. More specifically, one end of the first measurement resistor MR1 is electrically connected to the second node N2, and the other end of the first measurement resistor MR1 is electrically connected to one end of the first measurement contactor MC1. Subsequently, the other end of the first measurement contactor MC1 is electrically connected to the first node N1. That is, the first measurement resistor MR1 and the first measurement contactor MC1 are electrically connected in series between the first node N1 and the second node N2.

The second measurement resistor MR2 is electrically connected between the first node N1 and the third node N3. At this time, the second measurement contactor MC2 is electrically connected between the second measurement resistor MR2 and the first node N1. More specifically, one end of the second measurement resistor MR2 is electrically connected to the third node N3, and the other end of the second measurement resistor MR2 is electrically connected to one end of the second measurement contactor MC2. Subsequently, the other end of the second measurement contactor MC2 is electrically connected to the first node N1. That is, the second measurement resistor MR2 and the second measurement contactor MC2 are electrically connected in series between the first node N1 and the third node N3.

The third measurement resistor MR3 is electrically connected between the first node N1 and the fourth node N4. At this time, the third measurement contactor MC3 is electrically connected between the third measurement resistor MR3 and the first node N1. More specifically, one end of the third measurement resistor MR3 is electrically connected to the fourth node N4, and the other end of the third measurement resistor MR3 is electrically connected to one end of the third measurement contactor MC3. Subsequently, the other end of the third measurement contactor MC3 is electrically connected to the first node N1. That is, the third measurement resistor MR3 and the third measurement contactor MC3 are electrically connected in series between the first node N1 and the fourth node N4.

The measurement resistors MR1, . . . , MR3 described above may be resistors used to measure the voltage applied to the first charging contactor CC1 and the second charging contactor CC2. The measurement contactors MC1, . . . , MC3 electrically connected to the measurement resistors may serve to conduct or interrupt the current flowing through the measurement resistors MR1, . . . , MR3.

The sensing unit 110 is operatively coupled to the control unit 130. That is, the sensing unit 110 may be connected to the control unit 130 to transmit an electrical signal to the control unit 130 or to receive an electrical signal from the control unit 130.

The sensing unit 110 measures a battery voltage applied between the positive electrode terminal (+) and the negative electrode terminal (−) of the battery module B according to a preset cycle or the sensing control of the control unit 130.

Also, the sensing unit 110 measures a first measurement voltage, a second measurement voltage and a third measurement voltage applied to the first measurement resistor MR1, the second measurement resistor MR2 and the third measurement resistor MR3, respectively, according to the preset cycle or the sensing control of the control unit 130.

In addition, the sensing unit 110 measures a charging voltage Vc of the charger CS applied between the first input terminal IT1 and the second input terminal IT2 or between the first output terminal OT1 and the second output terminal OT2 according to the preset cycle or the sensing control of the control unit 130.

Also, the sensing unit 110 repeatedly measures the battery current flowing into or out of the battery module B.

After that, the sensing unit 110 may provide the measured signal representing the measured battery voltage, the first measurement voltage, the second measurement voltage, the third measurement voltage, the charging voltage Vc and the battery current to the control unit 130.

To this end, the sensing unit 110 includes a voltage sensor configured to measure the voltage of the battery module B. In addition, the sensing unit 110 may further include a current sensor configured to measure the current of the battery module B.

If the measured signal is received from the sensing unit 110, the control unit 130 may determine a digital value of each of the measured battery voltage, the first measurement voltage, the second measurement voltage, the third measurement voltage, the charging voltage Vc and the battery current, and store the digital value in the memory unit 120.

The memory unit 120 is a semiconductor memory device that records, erases and updates data generated by the control unit 130, and stores a plurality of program codes for diagnosing faults of the first charging contactor CC1 and the second charging contactor CC2, respectively. In addition, the memory unit 120 may store settings used when the present disclosure is implemented.

The memory unit 120 is not particularly limited as long as it is a semiconductor memory device known to be capable of recording, erasing and updating data. As one example, the memory unit 120 may be a dynamic random-access memory (DRAM), a synchronous dynamic random-access memory (SDRAM), a flash memory, a read-only memory (ROM), an electrically erasable programmable read-only memory (EEPROM), a register, or the like. The memory unit 120 may further include a storage medium storing program codes that define the control logic of the control unit 130. The storage medium includes a non-volatile storage element such as a flash memory or a hard disk. The memory unit 120 may be physically separated from the control unit 130 or may be integrated with the control unit 130.

The control unit 130 controls an operation state of at least one of the first measurement contactor MC1, the second measurement contactor MC2 and the third measurement contactor MC3 based on whether at least one of a charging start request signal and a charging end request signal is received.

Here, the charging start request signal and the charging end request signal may be signals output from an electronic control unit (ECU) of a vehicle that includes the battery pack according to the present disclosure.

In addition, if the charging start request signal is outputted from the ECU of the vehicle, as shown in FIG. 1, the first power connector C1 and the second power connector C2 of the charger CS may be in a coupled state in order to initiate charging.

If the charging start request signal is received, firstly, the control unit 130 controls the operation states of the first measurement contactor MC1, the second measurement contactor MC2 and the third measurement contactor MC3 to turn on. After that, the control unit 130 controls the operating states of the first charging contactor CC1 and the second charging contactor CC2 to turn on.

That is, if the charging start request signal is received, the control unit 130 controls the operation states of the first measurement contactor MC1, the second measurement contactor MC2 and the third measurement contactor MC3 to turn on before the operation states of the first charging contactor CC1 and the second charging contactor CC2 come into the turn-on state.

By doing so, the control unit 130 may monitor the voltage applied to the first charging contactor CC1 and the second charging contactor CC2 before a charging current is applied from the charger CS to the first charging contactor CC1 and the second charging contactor CC2.

Meanwhile, if the charging end request signal is output from an ECU of a vehicle, charging may be completed so that the first power connector C1 and the second power connector C2 of the charger CS may be in a state just before being separated.

Accordingly, if the charging end request signal is received, the control unit 130 receives firstly controls the operation state of the first charging contactor CC1 to turn off. After that, the control unit 130 controls the operation states of the first measurement contactor MC1 and the second measurement contactor MC2 based on a measurement voltage difference between the first measurement voltage and the second measurement voltage applied to the first measurement resistor MR1 and the second measurement resistor MR2, respectively.

More specifically, if the measurement voltage difference between the first measurement voltage and the second measurement voltage is equal to or greater than a preset first control voltage, the control unit 130 controls the operation states of the first measurement contactor MC1 and the second measurement contactor MC2 to turn off.

That is, if the charging end request signal is received, the control unit 130 controls the operation state of the first charging contactor CC1 to turn off, and if the operation state of the first charging contactor CC1 is controlled to turn off, the control unit 130 controls the operation states of the first measurement contactor MC1 and the second measurement contactor MC2 to turn off.

At this time, if the measurement voltage difference between the first measurement voltage and the second measurement voltage is equal to or greater than the preset first control voltage, the control unit 130 may control only the operation state of the second measurement contactor MC2 to turn off.

In this way, if the first power connector C1 is separated from the second power connector C2 of the charger as the control unit 130 completes charging as shown in FIG. 2, the control unit 130 may control the operation states of the first measurement contactor MC1 and the second measurement contactor MC2 to turn off so that no voltage is applied to the first input terminal IT1, thereby preventing a user from being electrically shocked by the first input terminal IT1 that may be exposed to the outside during the charging process.

Meanwhile, if the charging end request signal is received, the control unit 130 firstly controls the operation state of the second charging contactor CC2 to turn off. After that, the control unit 130 controls the operation state of the third measurement contactor MC3 based on the third measurement voltage applied to the third measurement resistor MR3.

More specifically, if the third measurement voltage is equal to or greater than the preset second control voltage, the control unit 130 controls the operation state of the third measurement contactor MC3 to turn off.

That is, if the charging end request signal is received, the control unit 130 controls the operation state of the second charging contactor CC2 to turn off, and if the operation state of the second charging contactor CC2 is controlled to turn off, the control unit 130 controls the operation state of the third measurement contactor MC3 to turn off.

In this way, if the first power connector C1 is separated from the second power connector C2 of the charger as the control unit 130 completes charging as shown in FIG. 2, the control unit 130 may control the operation state of the third measurement contactor MC3 to turn off so that no voltage is applied to the second input terminal IT2, thereby preventing a user from being electrically shocked by the second input terminal IT2 that may be exposed to the outside during the charging process.

Meanwhile, the control unit 130 may selectively include a processor, an application-specific integrated circuit (ASIC), another chipset, a logic circuit, a register, a communication modem, a data processing device or the like in order to execute various control logics. At least one of the various control logics executable by the control unit 130 may be combined, and the combined control logic is written in a computer-readable code system and recorded on a computer-readable recording medium. The recording medium has no limitation as long as it can be accessed by the processor included in a computer. As one example, the recording medium includes at least one selected from the group consisting of a ROM, a RAM, a register, a CD-ROM, a magnetic tape, a hard disk, a floppy disk and an optical data recording device.

Hereinafter, a battery pack 100' according to another embodiment of the present disclosure will be described. In the battery pack 100' according to another embodiment of the present disclosure, some components may be further included and some components may have different functions, compared to the battery pack 100 according to the former embodiment of the present disclosure. Accordingly, the same features will not be described again.

Figure 3:
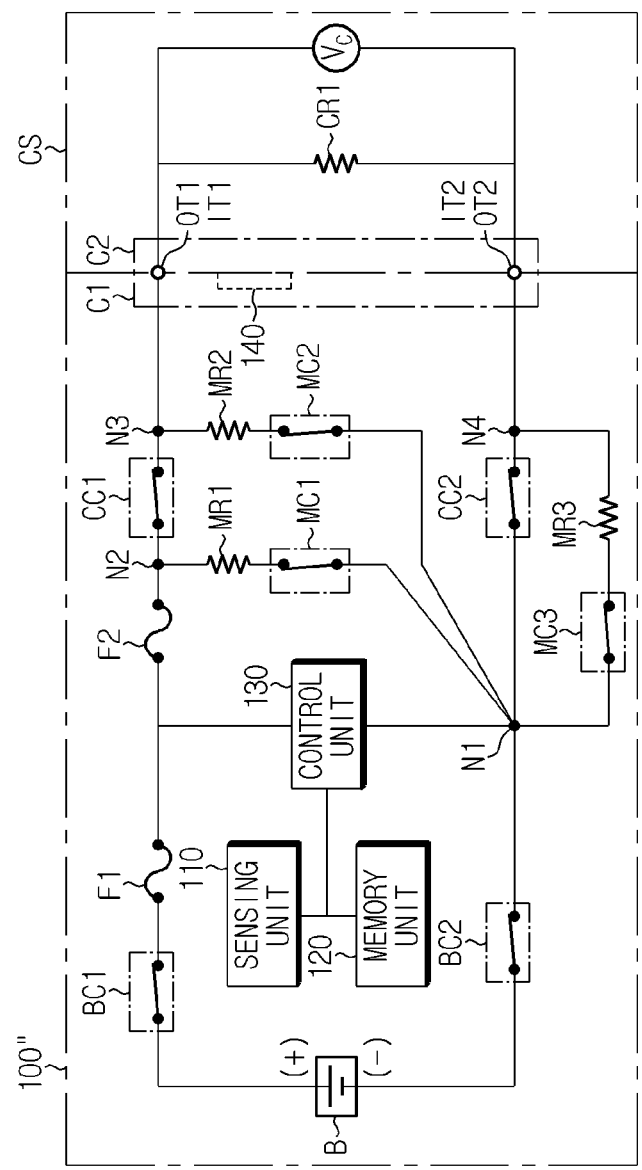
FIG. 3 is a diagram showing a functional configuration of a battery pack according to another embodiment of the present disclosure in a state where the battery pack is coupled to a charger.
Figure 4:
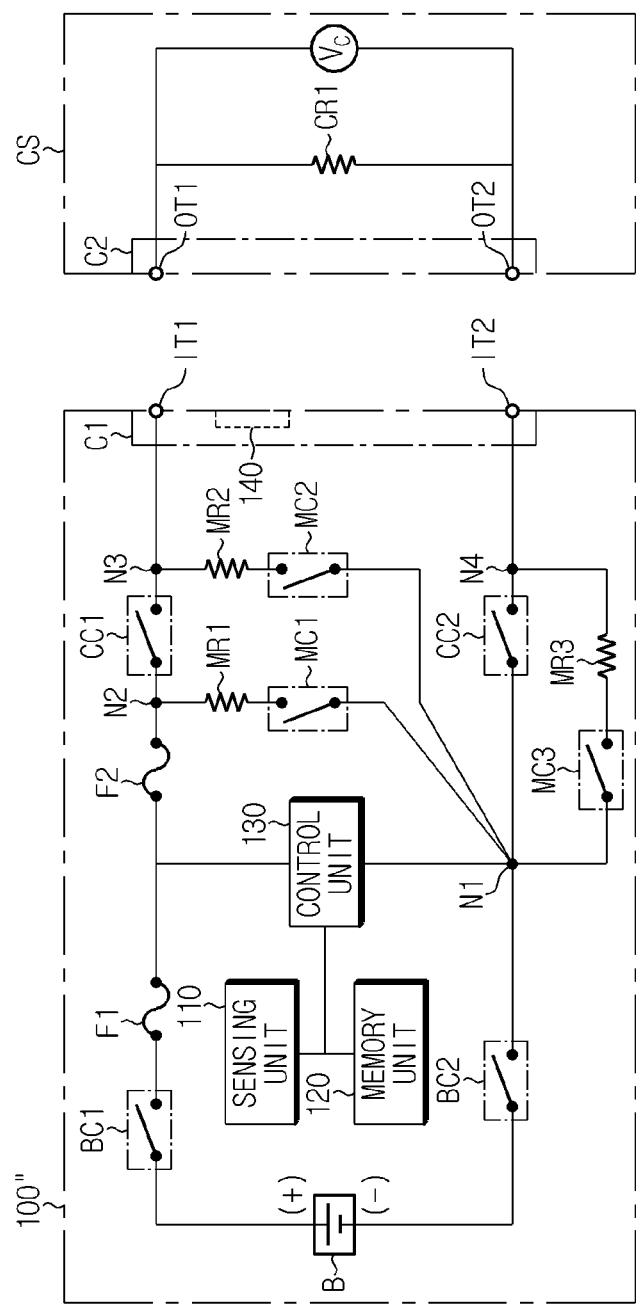
FIG. 4 is a diagram showing a functional configuration of the battery pack according to another embodiment of the present disclosure in a state where the battery pack is separated from the charger.

FIG. 3 is a diagram showing a functional configuration of the battery pack 100' according to another embodiment of the present disclosure in a state where the battery pack 100' is coupled to a charger CS, and FIG. 4 is a diagram showing a functional configuration of the battery pack 100' according to another embodiment of the present disclosure in a state where the battery pack 100' is separated from the charger CS.

Referring to FIGS. 3 and 4, the battery pack 100' according to another embodiment of the present disclosure may further include an illumination intensity sensing unit 140, compared to the battery pack 100 according to the former embodiment of the present disclosure.

The illumination intensity sensing unit 140 is installed at an inner side of the first power connector C1 to sense an illumination intensity around the first power connector C1.

More specifically, if the first power connector C1 and the second power connector C2 of the charger CS are coupled, the illumination intensity sensing unit 140 is installed on a surface of the first power connector C1 inside the space sealed by the first power connector C1 and the second power connector C2 of the charger CS.

Meanwhile, the first power connector C1 may include a connector cover.

At this time, if the connector cover is closed, the illumination intensity sensing unit 140 is installed on the surface of the first power connector C1 inside the inner space of the first power connector C1 and the space sealed by the connector cover.

That is, if the first power connector C1 is coupled to the second power connector C2 of the charger CS or the connector cover of the first power connector C1 is closed, the illumination intensity sensing unit 140 may be located in a sealed space into which no light is introduced, as shown in FIG. 3.

By using this, the control unit 130 compares the illumination intensity around the first power connector C1 measured by the illumination intensity sensing unit 140 with a preset reference illumination intensity, and controls the operation state of at least one of the first measurement contactor MC1, the second measurement contactor MC2 and the third measurement contactor MC3 based on the comparison result.

Here, the preset reference illumination intensity may be an illumination intensity value for determining whether the first input terminal IT1 and the second input terminal IT2 of the first power connector C1 are exposed to the outside.

More specifically, if the illumination intensity around the first power connector C1 measured by the illumination intensity sensing unit 140 is equal to or greater than the preset reference illumination intensity, as shown in FIG. 4, the control unit 130 determines that the first power connector C1 is separated from the second power connector C2 of the charger CS or the connector cover of the first power connector C1 is opened.

That is, if the illumination intensity around the first power connector C1 measured by the illumination intensity sensing unit 140 is equal to or greater than the preset reference illumination intensity, the control unit 130 determines that the first input terminal IT1 and the second input terminal IT2 of the first power connector C1 are exposed to the outside.

Conversely, if the illumination intensity around the first power connector C1 measured by the illumination intensity sensing unit 140 is smaller than the preset reference illumination intensity, as shown in FIG. 3, the control unit 130 determines that the first power connector C1 is coupled to the second power connector C2 of the charger CS or the connector cover of the first power connector C1 is closed.

That is, if the illumination intensity around the first power connector C1 measured by the illumination intensity sensing unit 140 is smaller than the preset reference illumination intensity, the control unit 130 determines that the first input terminal IT1 and the second input terminal IT2 of the first power connector C1 are not exposed to the outside.

After that, if the illumination intensity around the first power connector C1 measured by the illumination intensity sensing unit 140 is equal to or greater than the preset reference illumination intensity, the control unit 130 controls the operation states of the first measurement contactor MC1, the second measurement contactor MC2 and the third measurement contactor MC3 to turn off.

In addition, if the illumination intensity around the first power connector C1 measured by the illumination intensity sensing unit 140 is equal to or greater than the preset reference illumination intensity, the control unit 130 controls the operation states of the first charging contactor CC1 and the second charging contactor CC2 to turn off.

By doing so, if the first input terminal IT1 and the second input terminal IT2 of the first power connector C1 are exposed to the outside, the control unit 130 controls the operation states of the first measurement contactor MC1, the second measurement contactor MC2 and the third measurement contactor MC3 to turn off, thereby preventing an accident that a user is electrically shocked by the first input terminal IT1 or the second input terminal IT2 exposed to the outside.

Meanwhile, a vehicle according to the present disclosure may include the battery pack according to the present disclosure described above.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A battery pack, comprising:
   a first battery contactor, wherein a first end of the first battery contactor is configured to be electrically connected to a positive electrode terminal of a battery;
   a second battery contactor, wherein a first end of the second battery contactor is configured to be electrically connected to a negative electrode terminal of the battery;

a first charger contactor, wherein a first end of the first charger contactor is electrically connected to a second end of the first battery contactor;

a second charger contactor, wherein a first end of the second charger contactor is electrically connected to a second end of the second battery contactor;

a first measurement resistor electrically connected between a first node located at the first end of the second charger contactor and a second node located at the first end of the first charging contactor;

a second measurement resistor electrically connected between the first node and a third node located at a second end of the first charger contactor;

a third measurement resistor electrically connected between the first node and a fourth node located at a second end of the second charger contactor;

a first measurement contactor, electrically connected between the first node and the first measurement resistor;

a second measurement contactor electrically connected between the first node and the second measurement resistor;

a third measurement contactor electrically connected between the first node and the third measurement resistor; and a control unit configured to control at least one of an operation state of the first measurement contactor, an operation state of the second measurement contactor or an operation state of the third measurement contactor based on whether at least one of a charging start request signal or a charging end request signal is received.

2. The battery pack according to claim 1, wherein when the charging start request signal is received, the control unit is configured to:

control the operation states of the first measurement contactor, the second measurement contactor and the third measurement contactor to turn on; and subsequently control operation states of the first charger contactor and the second charger contactor to turn on.

3. The battery pack according to claim 1, wherein when the charging end request signal is received, the control unit is configured to:

control an operation state of the first charger contactor to turn off;

subsequently control the operation states of the first measurement contactor and the second measurement contactor based on a measured voltage difference between a first measured voltage measured across the first measurement resistor and a second measured voltage measured across the second measurement resistor.

4. The battery pack according to claim 3, wherein when the measured voltage difference is equal to or greater than a preset first control voltage, the control unit is configured to control the operation states of the first measurement contactor and the second measurement contactor to turn off.

5. The battery pack according to claim 1, wherein when the charging end request signal is received, the control unit is configured to:

control an operation state of the second charger contactor to turn off; and subsequently control the operation state of the third measurement contactor based on a third measured voltage measured across the third measurement resistor.

6. The battery pack according to claim 5, wherein when the third measured voltage is equal to or greater than a preset second control voltage, the control unit is configured to control the operation state of the third measurement contactor to turn off.

7. A vehicle, comprising a battery pack according to claim 1.

* * * * *